United States Patent [19]

Yamamoto et al.

[11] Patent Number: 4,885,224
[45] Date of Patent: Dec. 5, 1989

[54] LIGHT-SENSITIVE MATERIAL CONTAINING SILVER HALIDE, REDUCING AGENT, POLYMERIZABLE COMPOUND AND A DECOLORIZABLE DYE

[75] Inventors: Soichiro Yamamoto; Ken Kawata, both of Kanagawa, Japan

[73] Assignee: Fuji Photo Film Co., Ltd., Kanagawa, Japan

[21] Appl. No.: 108,349

[22] Filed: Oct. 14, 1987

[30] Foreign Application Priority Data

Oct. 14, 1986 [JP] Japan ................. 61-243551

[51] Int. Cl.$^4$ .................. G03C 1/72; G03C 1/84
[52] U.S. Cl. .................. 430/138; 430/203; 430/270; 430/281; 430/510; 430/517
[58] Field of Search .......... 430/138, 271, 517, 203, 430/253, 254, 281, 292

[56] References Cited

U.S. PATENT DOCUMENTS

| | | | |
|---|---|---|---|
| 3,694,252 | 9/1972 | Gerber et al. | 430/138 |
| 3,694,253 | 9/1972 | Gerber et al. | 430/138 |
| 4,033,948 | 7/1977 | Brown | 430/617 |
| 4,088,497 | 5/1978 | Brown et al. | 430/619 |
| 4,508,897 | 4/1985 | Bedekovic et al. | 546/273 |
| 4,536,463 | 8/1985 | Sanders | 430/138 |
| 4,624,910 | 11/1986 | Takeda | 430/203 |
| 4,629,676 | 12/1986 | Hayakawa et al. | 430/203 |
| 4,649,098 | 3/1987 | Takeda | 430/270 |

FOREIGN PATENT DOCUMENTS 203613  12/1986  European Pat. Off. .

*Primary Examiner*—Paul R. Michl
*Assistant Examiner*—Patrick A. Doody
*Attorney, Agent, or Firm*—Sughrue, Mion, Zinn, MacPeak & Seas

[57] ABSTRACT

A light-sensitive material comprising a light-sensitive layer which contains silver halide, a reducing agent, a polymerizable compound and a color image forming substance provided on a support (the silver halide, polymerizable compound and color image forming substance are contained in microcapsules which are dispersed in the light-sensitive layer), characterized in that the microcapsules further contain a dye having a property of being decolorized when it is heated or irradiated with light.

10 Claims, No Drawings

LIGHT-SENSITIVE MATERIAL CONTAINING SILVER HALIDE, REDUCING AGENT, POLYMERIZABLE COMPOUND AND A DECOLORIZABLE DYE

BACKGROUND OF THE INVENTION

1. Field of the invention

This invention relates to a light-sensitive material comprising a light-sensitive layer containing silver halide, a reducing agent, a polymerizable compound and a color image forming substance provided on a support.

2. Description of prior art

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441 (the contents of these three publications are described in U.S. patent application Ser. No. 854,640).

The above-mentioned image forming methods are based on the principle in which the polymerizable compound is polymerized within the area where a latent image of the silver halide has been formed.

Japanese Patent Provisional Publication No. 61(1986)-260241 (corresponding to U.S. patent application Ser. No. 854,640 and European Patent Provisional Publication No. 0202490A) describes another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area is polymerized.

In the light-sensitive materials which are used for the above-mentioned image formign methods, a color image forming substance can be contained in the light-sensitive layer of the material to form a color image. The light-sensitive material containing the color image forming substance is described in Japanese Patent Provisional Publication No. 61(1986)-73145 (corresponding to U.S. Pat. No. 4,629,676 and European Patent Provisional Publication No. 0174634A2).

Further, the silver halide, the polymerizable compound and the color image forming substace can be contained in microcapsules which are dispersed in the light-sensitive layer. The light-sensitive material employing microcapsules is described in Japanese Patent Provisional Publication Nos. 61(1986)-275742 and 61(1986)-278849 (the contents of both publications are described in U.S. patent application Ser. No. 868,385 and European Patent Provisional Publication No. 0203613A). The light-sensitive material containing such microcapsules has an advantage in that an image improved in the sharpness can be obtained.

SUMMARY OF THE INVENTION

An object of the present invention is to provide a light-sensitive material in which the sensitivity of silver halide outside a desired wavelength region is reduced without bringing about color turbidity into the resulting image.

Another object of the present invention is to provide a light-sensitive material which is improved in the reproducibility of a full color image.

In order to improve the spectral sensitivity of the light-sensitive material, it is generally preferred to reduce the sensitivity of silver halide outside a desired wave length region. For example, when the spectral sensitivity of silver halide is varied employing a spectral sensitizing dye, the inherent spectral sensitivity of the silver halide (generally within blue light region) is preferably reduced. Therefore, a layer containing a dye absorbing light outside the desired wave length region (e.g., yellow filter layer) is provided on a light-sensitive layer in a conventional silver salt photographic system. In the conventional system, the dye is usually removed or bleached in a wet development process after exposure.

The light-sensitive material employing microcapsules is advantageously used in an image forming method comprising a heat development process and/or an image transfer process. It is not preferred in performing the image transfer process to provide an additional functional layer (e.g., yellow filter layer) on the light-sensitive layer. Further, it is extremely difficult to provide such a dye layer only on specific microcapsules in the case that two or more kinds of microcapsules are used. Furthermore, it is also difficult to remove or bleach the dye in a dry process (including the heat development process) in a similar manner as in a wet process using a developing solution.

There is provided by the present invention a light-sensitive material comprising a light-sensitive layer containing silver halide, a reducing agent, a polymerizable compound and a color image forming substance provided on a support, (the silver halide, polymerizable compound and color image forming substance are contained in microcapsules which are dispersed in the light-sensitive layer), wherein the microcapsules further contain a dye having a property of being decolorized when it is heated or irradiated with light.

Where the dye has a property of being decolorized when it is heated, the light-sensitive material of the invention can be advantegeously used in a process which comprises:

imagewise exposing the light-sensitive material to form a latent image of the silver halide while filtering light with the dye, and heating the light-sensitive material simultaneously with or after the exposure to polymerize the polymerizable compound within the area where the latent image of the silver halide has been formed (or the area where the latent image of the silver halide has not been formed) and to decolorize the dye.

Where the dye has a property of being decolorized when it is irradiated with light, the light-sensitive material of the invention can be advantegeously used in a process which comprises:

imagewise exposing the light-sensitive material to form a latent image of the silver halide while filtering light with the dye, heating the light-sensitive material simultaneously with or after the exposure to polymerize the polymerizable compound within the area where the latent image of the silver halide has been formed (or the area where the latent image of the silver halide has not been formed), pressing the light-sensitive material on an image-receiving material to transfer the unpolymerized polymerizable compound, and irradiating the image-receiving material with light in the presence of a photo polymerization initiator to polymerize the unpolymerized polymerizable compound and to decolorize the dye.

The light-sensitive material of the invention can give an improved full color image, for instance, in the case that the microcapsules comprises at least three kinds of microcapsules (I), (II) and (III), the microcapsule (I) containing a blue sensitive silver halide, a polymerizable compound and a yellow color image forming substance, the microcapsule (II) containing a green sensitive silver halide, a polymerizable compound, a magenta color image forming substance and a yellow dye having a property of being decolorized when it is heated or irradiated with light, and the microcapsule (III) containing a red sensitive silver halide, a polymerizable compound, a cyan color image forming substance and a yellow dye having a property of being decolorized when it is heated or irradiated with light.

The light-sensitive material of the present invention is characterized in that the whole or a portion of the microcapsules further contains a dye having a property of being decolorized when it is heated or irradiated with light.

In the light-sensitive material of the invention, the dye absorbing light outside the desired wavelength region is contained in the microcapsules in place of an additional layer provided on the light-sensitive layer. Accordingly, the image transfer process of the light-sensitive material can be easily performed, and the light-sensitive material can give a clear transferred image.

The dye contained in the microcapsules does not give an adverse effect to the resulting color image, because the dye used in the present invention has a property of being decolorized when it is heated or irradiated with light. Further, the dye can be decolorized with a procedure of a dry process simultaneously with or after the image formation.

As a result, in the light-sensitive material of the invention, the sensitivity of silver halide outside a desired wave length region can be reduced without causing color turbidity in the resulting image. When the spectral sensitivity of silver halide is varied employing a spectral sensitizing dye, the inherent spectral sensitivity of the silver halide (generally within blue light region) can be much reduced. When a spectral sensitizing dye absorbed on silver halide does not have an appropriate spectral characteristics, the spectral characteristics may be modified. Further, when there is a disadvantageous difference in sensivity between two or more microcapsules, whether a sensitizing dye is present or not, the difference in the sensitivity can be easily corrected using the dye contained the light-sensitive material of the invention. Furthermore, the dye used in the light-sensitive material of the invention can function as an antihalation dye or an antiirradiation dye.

In the case that a full color image is formed using the light-sensitive material containing three or more kinds of microcapsules, the light-sensitive material of the present invention has an advantage of the improved reproducibility of the full color image, because each of the microcapsules corresponds exactly to light within the desired wavelength region.

DETAILED DESCRIPTION OF THE INVENTION

The dye used in the light-sensitive material of the invention has a property of being decolorized when it is heated or irradiated with light.

In the present specification, the term "dye" is used to include a pigment and other coloring matters in addition to a most conventional meaning of the term "dye". Further, the property of being decolorized means that the fading reaction of the dye is substantially irreversible.

Where the dye has a property of being decolorized when it is heated, the heating temperature required to decolorize the dye preferably is not lower than 60° C.

Examples of the dye having a property of being decolorized when it is heated include a dye used in and antihalation layer of a light-sensitive or heat-sensitive material described in U.S. Pat. No. 3,769,019; 8-hydroxyquinone vanadium complex used in a antihalation layer described in U.S. Pat. No. 3,821,001; a methine allyliden dye described in U.S. Pat. No. 4,033,948; a methine allylidene dye used in a heat developable light-sensitive material stated in U.S. Pat. No. 4,088,497; a combination of hexaarylbiimidazole and a formazan dye used in a photographic element described in Japanese Patent Provisional Publication No. 54(1979)-56818; a magenta dye used in a heat-sensitive photographic emulsion described in Japanese Patent Provisional Publication No. 53(1978)-132334; a combination of a merocyanine dye and an oxidazer described in Japanese Patent Provisional Publication No. 54(1979)-61541; a nitron compound stated in Japanese Patent Application Nos.

59(1984)-240285 and 60(1985)-180293; and a diazonium salt described in Japanese Patent Application No. 60(1985)-32335.

Another example of the dye having a property of being decolorized when it is heated is a compound having the following formula:

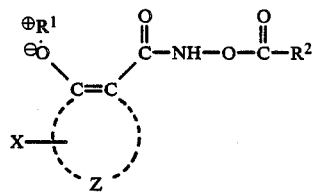

in which Z is a hydrocarbon chain which forms a 6-membered ring or its condensed ring; X is a substituent group having a function of forming a chromophoric group having an absorption maximum at not less than 350 nm in conjugation of $-O.R^1$; $R^1$ is a monovalent cation selected from the group consisting of hydrogen ion, a metal ion and a quaternary ammonium ion (when $R^1$ is hydrogen atom, $-O.R^1$ forms hydroxyl); and $R^2$ is a monovalent group selected from the group consisting of hydrogen, an alkyl group, an aryl group, a heterocyclic group, amino and anilino, each of which may have one or more substituent groups.

The dye having the above-mentioned formula is a novel dye having a property of being decolorized when it is heated. When the dye is heated and/or arranged in an alkaline condition, the absorption maximum of the dye is greatly shifted into a shorter wavelength region and at the same time, the absorption coefficient is reduced. Therefore, the dye having the above-mentioned formula is very advantageous for a light-sensitive material of the present invention which is preferably developed in an alkaline condition. The dye used in the light-sensitive material of the present invention can be sufficiently decolorized (including a shift of the absorption maximum into a shorter wavelength region) only by heating the material in a heat development process. If desired, an image-receiving material can be heated to more completely decolorize the dye, after an image is transferred to the image-receiving material.

Examples of the dye having the above-mentioned formula are described hereinafter.

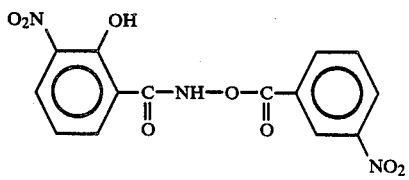 (1)

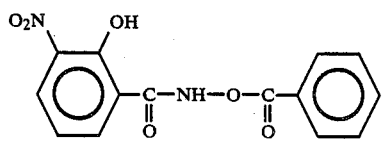 (2)

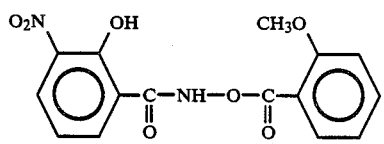 (3)

-continued

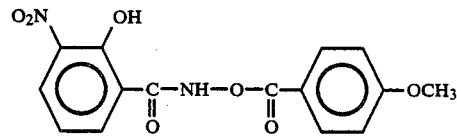 (4)

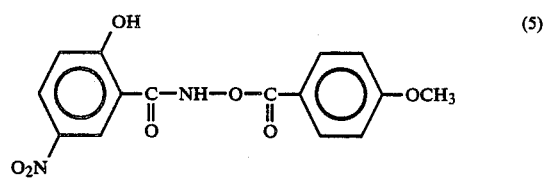 (5)

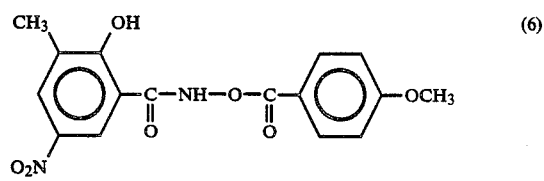 (6)

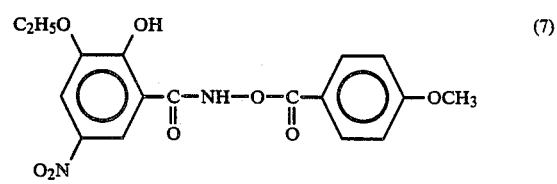 (7)

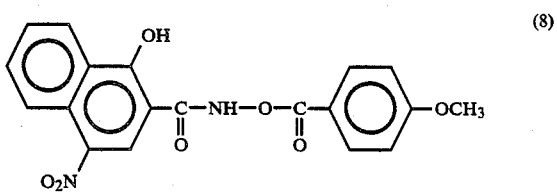 (8)

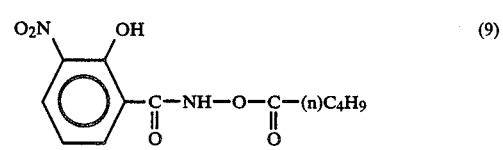 (9)

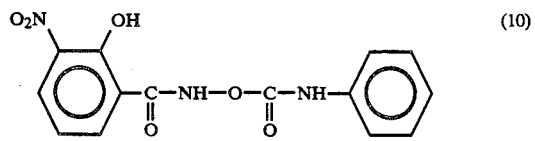 (10)

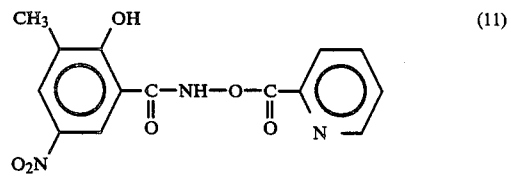 (11)

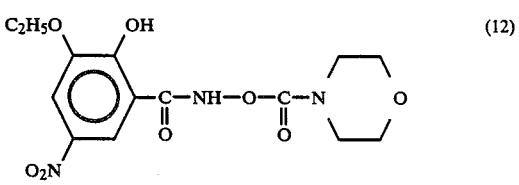 (12)

-continued

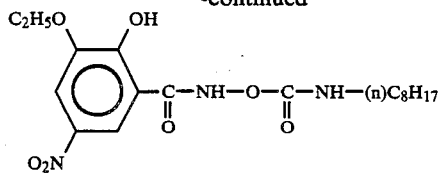  (13)

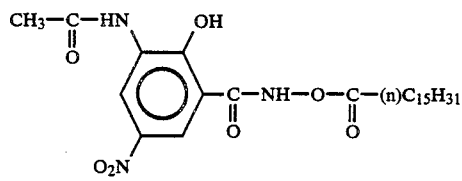  (14)

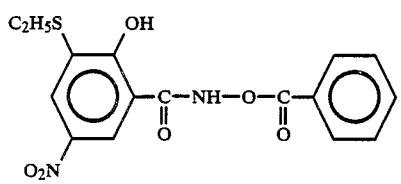  (15)

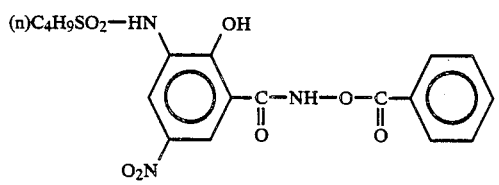  (16)

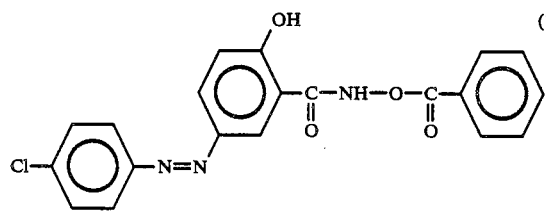  (17)

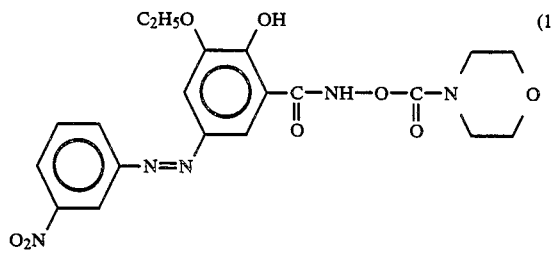  (18)

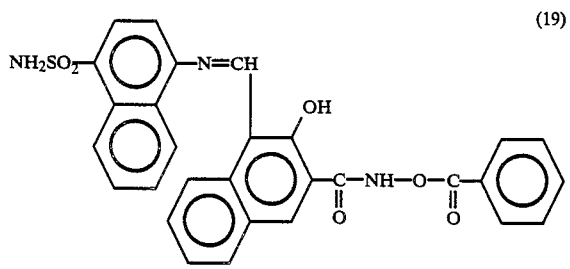  (19)

In the case that the dye has a property of being decolorized when it is irradiated with light, the illuminance of the irradiation required to decolorize the dye preferably is not less than 100 lux.

The dye having a property of being decolorized when it is irradiated with light generally is a dye having a light fastness corresponding to class 1 in the blue scale of light fastness. Examples of the dye include o-nitro-o-azaallylidene dye used in a photographic element stated in Japanese Patent Provisional Publication No. 54(1979)-17833; and a combination of a photo-acid generating agent and a dye capable of being decolorized at low pH used in a photographic element described in Japanese Patent Provisional Publication No. 57(1982)-68831 (corresponding to U.S. Pat. No. 4,376,162).

These dyes having a property of being decolorized when it is heated or irradiated with light can be used singly or in combination. Further, the property of the dye can be present in a combination of two or more components, as shown in the above-mentioned examples.

There is no limitation with regard to the hue of the dye. In the case that the inherent spectral sensitivity of silver halide (within blue light region) is to be reduced in a practical use of the light-sensitive material, a yellow dye (pigment) is used. In other words, when the silver halide contained in a microcapsule has a spectral sensitivtity to light other than blue light, the dye contained in the microcapsule preferably is a yellow dye.

It is particularly preferred to use the light-sensitive material of the present invention in an image forming method employing a heat development process as described above. Accordingly, the dye having a property of being decolorized when it is heated is usually preferable to that having a property of being decolorized when it is irradiated with light. This is because the former dye does not require an extra decolorizing treatment, compared with the latter dye. However, in the case that an image-receiving material to which an image containing an unpolymerized polymerizable compound has been transferred is irradiated with light to fix the image, either of the dye can be advantageously used. Where the dye is insufficiently decolorized in the image-forming process or in the image-fixing process, the light-sensitive material or an image-receiving material to which an image has been transferred can be further heated or irradiated with light with another image-forming process or after the image-forming process. In any case, the dye used in the present invention can be decolorized by a simple manner.

The amount of the dye to be used various depending on the type of each dye and the purpose of use. The dye is generally used in such an amount that the reflection density of the light-sensitive layer is increased by at least 0.1, preferably at least 0.5.

In the light-sensitive material of the present invention, the above-described dye is contained in the whole or a portion of the microcapsules. The dye may be contained in the core material or the shell material of the microcapsules, or may be adsorbed on the outer surface of the shell of the microcapsules.

The dye can be adsorbed on silver halide contained in the microcapsules in a similar manner as a spectral sensitizing dye adsorbed on silver halide. However, another silver halide emulsion should be used to prepare the light-sensitive material of the invention in combination with the dispersion of the dye (i.e., silver halide emulsion in which the dye is adsorbed on silver halide), because the silver halide on which the dye is adsorbed is much decreased in the sensitivity. In other words, the dye is not adsorbed on (is separated from) light-sensitive silver halide in the microcapsules. The process for preparation of the light-sensitive material including preparation of the silver halide emulsion will be described in more detail hereinafter.

The dye having the property is not always contained in all of the microcapsules. For example, the dye is not contained in a microcapsule which contains a blue sensitive silver halide. In other words, the light-sensitive layer can further contain another microcapsule which contains a blue sensitive silver halide, a polymerizable compound and a color image forming substance.

The microcapsules contained in the light-sensitive layter can comprise at least three kinds of microcapsules (I), (II) and (III), wherein the microcapsule (I) contains a blue sensitive silver halide, a polymerizable compound and a color image forming substance, the microcapsule (II) contains a green sensitive silver halide, a polymerizable compound, a color image forming substance and a yellow dye having a property of being decolorized when it is heated or irradiated with light, and the microcapsule (III) contains a red sensitive silver halide, a polymerizable compound, a color image forming substance and a yellow dye having a property of being decolorized when it is heated or irradiated with light. In this embodiment, the three hues of the color image forming substances contained in the microcapsules (I), (II) and (III) can be yellow, magenta and cyan to give a full color image.

In the case that a full color image is formed, each of the above-mentioned microcapsules can correspond exactly to light within the desired wave length region. Therefore, the light-sensitive material of the present invention has an advantage of the improved reproducibility of the full color image. Further, the light-sensitive material of the invention can give an improved clear full color image which is reduced in the impurity of the color, because the interaction and transference of the components between the neighboring image elements (i.e., microcapsules) are restricted by the microcapsule.

Further, the microcapsules can comprise at least three kinds of microcapsules (I), (II) and (III), wherein the microcapsule (I) contains a blue sensitive silver halide, a polymerizable compound and a yellow color image forming substance, the microcapsule (II) contains a green sensitive silver halide, a polymerizable compound, a magenta color image forming substance and a yellow dye having a property of being decolorized when it is heated or irradiated with light, and the microcapsule (III) contains a red sensitive silver halide, a polymerizable compound, a cyan color image forming substance and a yellow dye having a property of being decolorized when it is heated or irradiated with light. This embodiment of the light-sensitive material can give a clear natural color image accoring to a known subtractive color process.

Furthermore, the microcapsules can comprise at least four kinds of microcapsules (I), (II), (III) and (IV), wherein the microcapsule (I) contains a blue sensitive silver halide, a polymerizable compound and a yellow color image forming substance, the microcapsule (II) contains a green sensitive silver halide, a polymerizable compound, a magenta color image forming substance and a yellow dye having a property of being decolorized when it is heated or irradiated with light, the microcapsule (III) contains a red sensitive silver halide, a polymerizable compound, a cyan color image forming substance and a yellow dye having a property of being decolorized when it is heated or irradiated with light, and the microcapsule (IV) contains silver halide, a polymerizable compound and a black color image forming substance. This embodiment of the light-sensitive material can give a clear image improved within the area which should have a clear black color, such as a character. The improvement of the black area is possible with the light-sensitive material employing microcapsules, because the interaction and transference of components between the neighboring image elements are restricted by the microcapsules. In the case that a gray color is unbalance in the image formation employing the microcapsules (I), (II) and (III), the gray color can be corrected by the microcapsule (IV) containing a black color image forming substance composed of two or more substances.

In the case that the polymerizable compound within the area where the latent image has been formed is polymerized, the sensitivity of the silver halide in the microcapsules (IV) is preferably higher than that in other microcapsules. On the other hand, in the case that the polymerizable compound within the area where the latent image has not been formed is polymerized, the sensitivity of the silver halide in the microcapsules (V) is preferably lower than that in other microcapsules.

The light-sensitive material of the invention has various embodiments other than those mentioned above. The light-sensitive material can employ five or more kinds of microcapsules, and all of the microcapsules is not necessarily defined by the present invention.

The silver halide, the reducing agent, the polymerizable compound, the color image forming substance, the microcapsules containing these components and the support which constitute the light-sensitive material of the invention are described below. Thus composed material is referred hereinafter to as "light-sensitive material".

There is no specific limitation with respect to silver halide contained in the light-sensitive layer of the light-sensitive material. Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be used.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291-334 (1977), Research Disclosure No. 17029, pp. 9-15 (Jun. 1978), and Research Disclosure No. 17643, pp. 22-31 (Dec. 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called super-additivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)-phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-tri-tyl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)-butyloyl}-2-(p-or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p-or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl} phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the leuco dyes in the course of polymerization hardening of the polymerizable compounds.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes or pigments (i.e., colored substance) emplyable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or dispersion. In the present invention, these dyes and pigments used as color image forming substances, of course, do not have a property of of being decolorized when it is heated or irradiated with light.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two ore more components, such as acidbase reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29-58 (pressure-sensitive copying paper), pp. 87-95 (azo-graphy), pp. 118-120 (heat-sensitive color formation by a chemical change) or in MSS. of the seminer promoted by the Society of Kinki Chemical Industry, "The Newest Chemistry of Coloring Matter - Attractive Application and New Development as a Functional Coloring Matter", pp. 26-32 (Jun. 19, 1980). Examples of the color formation systems specifically include a color formation system used in pressure-sensitive papers, etc., comprising a color former having a partical structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system usilizing oxidation-reduction reaction, such as a reaction between ferric stearate and pyrogallol, or a reaction between silver behenate and 4-methoxy-1-naphthol, etc.

In the case that the color image forming substance comprising two components (e.g., color former and a developer), one component and the polymerizable compound is contained in the microcapsule, and the other component is arranged outside of the microcapsule in the light-sensitive layer, a color image can be formed on the light-sensitive layer.

The color image forming substance in the light-sensitive material is preferably used in an amount of from 0.5 to 20 parts by weight, and more preferably from 2 to 7 parts by weight, per 100 parts by weight of the polymerizable compound. In the case that the developer is used, it is preferably used in an amount of from about 0.3 to about 80 parts by weight per one part by weight of the color former.

The silver halide, the polymerizable compound, the color image forming substance and the dye having a property of being decolorized when it is heated or irradiated with light are contained in the microcapsules which are dispersed in the light-sensitive layer. There is no specific limitation on the microcapsules, and various known manners can be employed. The reducing agent and the other optional component can be contained in the microcapsules or arranged outside of the micorcapsules in the light-sensitive layer. Generally, the reducing agent is preferably contained in the microcapsule, because the reaction can progress smoothly in such case. The reducing agent is more preferably dispersed or dissolved in the core material of the microcapsules. In the case that the heat development is utilized in the use of the light-sensitive material, there is no problem in arranging the reducing agent outside of the microcapsule, because the reducing agent can permeate the microcapsule to reach the core material.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehyde resin, gelatin, epoxy resin, a complex resin containing polyamide resin and polyurea resin, a complex resin containing polyurethane resin and polyester resin.

The mean size of the microcapsule preferably ranges from 0.5 to 50 μm, more preferably 1 to 25 μm, most preferably 3 to 20 μm. In the light-sensitive material of the invention, the mean grain size of the silver halide grains preferably is not more than the 5th part of the mean size of the microcapsules, more preferably is not more than the 10th part. It is observed that when the mean size of the microcapsules is not less than 5 times as much as the mean grain size of silver halide, even and uniform image can be obtained. Further, the silver halide is preferably arranged in the shell material of the microcapsules.

The light-sensitive material can be prepared by arranging a light-sensitive layer containing the above-mentioned components on a support. There is no limitation with respect to the support. In the case that heat development is utilized in the use of the light-sensitive material, material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610.

The light-sensitive layer can further contain optional components such as sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiators and solvents of the polymerizable compound.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is adsorbed on silver halide in the light-sensitive material. The sensitizing dye is preferably added during the stage of the preparation of the silver halide emulsion (simultaneously with or after the grain formation).

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inoragnic bases, organic bases, base precursors, oils, surface active agents, compounds functioning as an anti-fogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

In the light-sensitive material, the silver halide, the reducing agent, the polymerizable compound and the color image forming substance are preferably contained in a microcapsule and the base or base precursor is prefarably arranged outside of the microcapsule in the light-sensitive layer. Further, the base or base precursor can be contained in a different microcapsule from that containing the polymerizable compound. The base or base precursor can be contained in the microcapsule under condition that the base or base precursor is dissolved or dispersed in an aqueous solution of a water retention agent, orr under condition that the base or base precursor is adsorbed on solid particles. Furthermore, the base or base precursor can be contained in a layer different from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure 26–28 (Dec. 1976). The light-sensitive material employing the hot-melt solvents is described in Japanese Patent Application No. 60(1985)-227527. The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

A dye or pigment can be contained in the light-sensitive layer for prevention of halation or irradiation. A white pigment is preferably employed as an antihalation or antiirradiation pigment.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991;

and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174364A2).

A photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, pp. 9-15 (Jun. 1978).

Examples of auxiliary layers which are optionally arranged on the light-sensitive material include an image-receiving layer, a heating layer, an antistatic layer, an anticurl layer, a release layer, a cover sheet or a protective layer, a layer containing a base or base precursor and a base barrier layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion), the reducing agent, or the leuco dye can be dissolved, emulsified or dispersed in the polymerizable compound to prepare the light-sensitive material. Especially, the leuco dye is preferably incorporated in the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, -OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; a spray-drying process as described in U.S. Pat. No. 3,111,407 and U.K. Patent No. 930,422; and the like. It is preferable, though not limitative, that the microcapsule is prepared by emulsifying core materials containing the polymerizable compound and forming a polymeric membrane (i.e., shell) over the core materials.

In the above-mentioned process, an aqueous dispersion of the microcapsules can be obtained. The dye having a property of being decolorized when it is heated or irradiated with light can be added at any of the stage in the preparation of the microcapsules. The other components can be added to the aqueous dispersion of the microcapsules.

A light-sensitive material of the invention can be prepared by coating and drying the dispersion of the microcapsules on a supprot in the conventional manner.

Use of the light-sensitive material is described below.

In the use of the light-sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Provisional Publication No. 61(1986)-294434. Further, the light-sensitive material can be heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized in the same manner as the light-sensitive material described in Japanese Patent Provisional Publication No. 61(1986)-260241.

A color image can be formed on the light-sensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include baryta paper in addition to various examples which can be employed as the support of the above mentioned light-sensitive material. In the case that a porous material, such as paper is employed as the support of the image-receiving material, the porous support preferably has such a surface characteristic that a filtered maximum waviness of not less than 4 μm is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing an image-receiving layer on the support. In the case that a dye of pigment is used as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$.cm/cm$^2$.sec.cmHg can be used as the binder to protect the color of the image formed on the image-receiving material.

The image-receiving layer can contain a granulated thermoplastic compound to obtain a glossy image. Further, the image-receiving layer can contain a white pigment such as titanium dioxide to function as a white reflection layer. Furthermore, a photo polymerization initiators or a thermal polymerization initiators can be contained in the image-receiving layer to polymerize the unpolymerizable polymerizable compound.

A dye or pigment can be contained in the image-receiving layer for the purpose of entering letters, symbols, frames etc. in the image-receiving layer, or of giving a certain color to the background of the image. Further, the dye or pigment can be also employed for the purpose of making it easy to distinguish the sides of the image-receiving material. In the case that it is possible that the dye or pigment disturbs the image formed on the image-receiving layer, it is preferred that the density of the dye or pigment is low (e.g. reflection density of not higher than 1), or the dye or pigment has a property of being decolored when it is heated or irradiated with light, which is the same as is used in the light-sensitive material of the invention.

Further, when a white pigment, such as titanium dioxide, barium sulfate etc. is contained in the image-receiving layer, the image-receiving layer can function as a white reflection layer. In this case, the white pigment is used in an amount of from 10 g to 100 g based on 1 g of the thermoplastic material.

The above-mentioned dye and pigment can be either uniformly or partially contained in the image-receiving layer. For example, when the support is composed of transparent material, the white pigment can be partially contained in the image-receiving layer to make a part of a reflection image to be transparent. Thus, information of the image which is unnecessary in a transparent image can be entered in the part of the image-receiving layer containing the white pigment as the reflection image.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer.

After the development process of pressing the light-sensitive material in contact with the image-receiving material to transfer the polymerizable compounds which is still polymerizable to the image-receiving material, a polymer image can be obtained in the image-receiving material. The process for pressing can be carried out by various known manners.

In the case that the light-sensitive layer contains a color image forming substance, the color image forming substance is fixed by polymerization of the polymerizable compound. Then, pressing the light-senstive material in contact with the image-receiving material to transfer the color image forming substance in unfixed portion, a color image can be produced on the image-receiving material.

After the image was obtained, the image-receiving material can be heated. In the above-mentioned method, an improved image can be obtained by polymerizing the unpolymerizable polymerized compound which has been transferred on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention thereto.

REFERENCE EXAMPLE 1

Preparation of silver halide emulsion

In 1,000 ml of water were dissolved 20 g of gelatin and 0.5 g of potassium bromide, and the resulting gelatin solution was adjusted to a pH of 3.8 using 1N of sulfuric acid and was kept at 70° C. To the gelatin solution, 600 ml of an aqueous solution containing 70 g of potassium bromide and 600 ml of an aqueous solution containing 0.59 mole of silver nitrate were added simultaneously at the same feed rate over a period of 50 minutes. After 5 minitues, to the solution, 100 ml of an aqueous solution containing 3.9 g of potassium iodide and 100 ml of an aqueous solution containing 0.024 mole of silver nitrate were added simultaneously at the same feed rate over a period of 5 minites to obtain a silver iodobromide emulsion having tetradecahedral grains, uniform grain size distribution, and a mean grain size of 0.25 μm.

The emulsion was washed for desalting and then added 82 ml of 1% methanol solution of the following sensitizing dye (a) to obtain a silver halide emulsion (A). The yield of the emulsion was 600 g.

(Sensitizing dye (a))

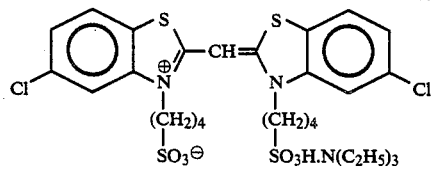

Preparation of silver benzotriazole emulsion

In 3,000 ml of water were dissolved 20 g of gelatin and 15 g of benzotriazole, and the solution was kept at 40° C. while stirring. To the solution was added 100 ml of an aqueous solution of 17 g of silver nitrate over 2 minutes. Excessive salts were sedimented and removed from the resulting emulsion. Thereafter, the emulsion was adjusted to pH 6.0 to obtain a silver benzotriazole emulsion. The yield of the emulsion was 400 g.

Preparation of light-sensitive composition

In 100 g of trimethylolpropane triacrylate were dissolved 0.1 g of the following copolymer (a), 13 g of the following color image forming substance (a) and 0.5 g of Emulex NP-8 (tradename of Nippon Emulsion Co., Ltd.).

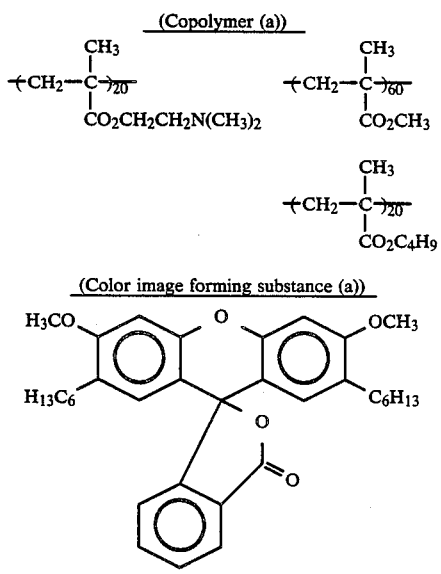

To 18 g of the resulting solution were added a solution in which 0.3 g of the following reducing agent (I) and 0.8 g of the following reducing agent (II).

(Reducing agent (I))

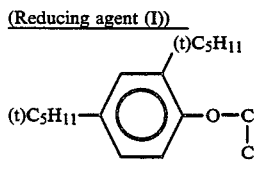

(Reducing agent (II))

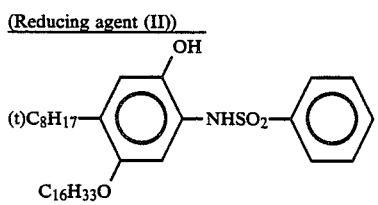

To the mixture were further added 1.0 g of the silver halide emulsion (A) and 0.2 g of the silver benzotriazole emulsion, and the mixture was stirred at 15,000 r.p.m. for 10 minutes to obtain a light-sensitive composition (A).

Preparation of light-sensitive microcapsule

To 9.0 g of 20% aqueous solution of Isobam (tradename of Kuraray Co., Ltd.) was added 50 g of 2.5% aqueous solution of pectin. After the solution was adjusted to a pH of 4.0 using 10% sulfuric acid, the light-sensitizing dye (b) to obtain a silver halide emulsion (B). The yield of the emulsion was 600 g.

(Sensitizing dye (b))

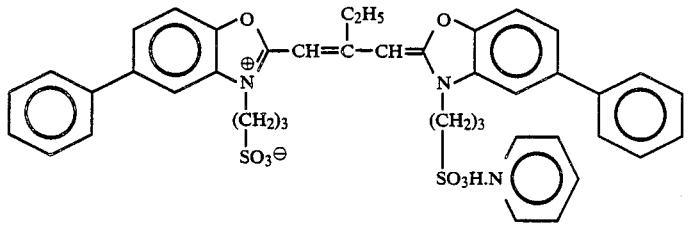

sensitive composition was added to the resulting solution, and the mixture was stirred at 7,000 r.p.m. for 5 minutes to emulsify the light-sensitive composition (A) in the aqueous medium.

To the aqueous emulsion were added 8.0 g of 40% aqueous solution of urea, 3.0 g of 10% aqueous solution of resorcinol, 8.0 g of 37% aqueous solution of formaldehyde, and 3.0 g of 8% aqueous solution of ammonium sulfate in this order, and the mixture was heated at 60° C. for 2 hours while stirring. After the mixture was adjusted to a pH of 7.0 using 10% aqueous solution of sodium hydroxide, 4.0 g of 30% aqueous solution of sodium hydrogen sulfite was added to the mixture to obtain a dispersion containing light-sensitive microcapsules (A).

Preparation of light-sensitive material

To 10.0 g of the light-sensitive microcapsule dispersion (A) were added 1.0 g of 5% aqueous solution of the following surfactant, 5.0 g of 10% solution (solvent: water/ethanol=80/20 as volume ratio) of guanidine trichroloacetate to prepare a coating solution.

(Surfactant)

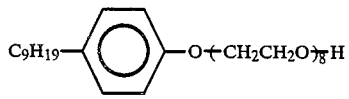

The coating solution was uniformly coated in a portion of 35 g/m² on a coated paper (cast coat paper; produced by Sanyo Pulp Co., Ltd.) having a basis weight of 65 g/m² and dried at about 40° C. to obtain a light-sensitive material (I).

COMPARISON EXAMPLE 1

Preparation of silver halide emulsion

In 1,500 ml of water were dissolved 16 g of gelatin and 0.5 g of sodium chrolide, and the resulting gelatin solution was adjusted to a pH of 3.8 using 1N sulfuric acid, and was kept at 60° C. To the gelatin solution, 300 ml of an aqueous solution containing 71 g of potassium bromide and 300 ml of an aqueous solution containing 0.5 mole of silver nitrate were added simultaneously at the same feed rate over a period of 50 miniutes. After 10 minutes, to the solution, 100 ml of an aqueous solution containing 2.9 g of potassium iodide was added over a period of 5 minutes to obtain a silver iodobromide emulsion having tetradecahedral grains, uniform grain size distribution, and a mean grain size of 0.22 μm.

The emulsion was washed for desalting and then added 50 ml of 1% methanol solution of the following sensitizing dye (b) to obtain a silver halide emulsion (B). The yield of the emulsion was 600 g.

Preparation of light-sensitive composition

A light-sensitive composition (B-1) was prepared in the same manner as in the preparation of the light-sensitive composition (A), except that 0.85 g of the silver halide emulsion (B) was used in place of 1 g of the silver halide emulsion (A) and 10 g of the following color image forming substance (b) was used in place of 13 g of color image forming substance (a).

(Color image forming substance (b))

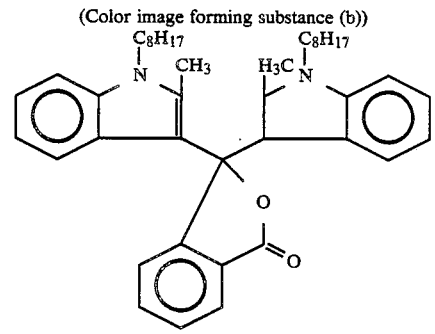

Preparation of light-sensitive microcapsule

A light-sensitive microcapsule dispersion (B-1) was prepared in the same manner as in the preparation of the light-sensitive microcapsule dispersion (A), except that the light-sensitive composition (B-1) was used in place of the light-sensitive composition (A).

Preparation of light-sensitive material

A light-sensitive material (II) was prepared in the same manner as in Reference Example 1, except that 10 g of the light-sensitive microcapsule dispersion (B-1) was used in place of 10 g of the light-sensitive microcapsule dispersion (A).

EXAMPLE 1

Preparation of dispersion of dye

In 1,000 ml of water were dissolved 20 g of gelatin and 0.5 g of potassium bromide, and resulting gelatin solution was adjusted to a pH of 3.8 using 1N of sulfuric acid and was kept at 50° C. To the gelatin solution, 600 ml of an aqueous solution containing 70 g of potassium bromide and 0.59 mole of silver nitrate were added simultaneously at the same feed rate over a period of 30 minutes to obtain a silver iodobromide emulsion having tetradecahedral grains, uniform grain size distribution, and a mean grain size of 0.10 μm.

The emulsion was washed for desalting and then added 126 ml of 2% methanol solution of the following dye (a), which has a property of being decolorized when it is heated, to obtain a dispersion of the dye (a) adsorbed on silver halide. The yield of the dispersion was 600 g.

(Dye (a))

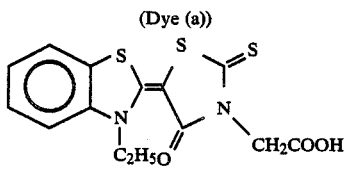

Preparation of light-sensitive composition

A light-sensitive composition (B-2) was prepared in the same manner as in the preparation of the light-sensitive composition (B-1), except that to the mixture which had been stirred at 15,000 r.p.m for 10 minutes using homogenizer was further added 0.6 g of the dispersion of the dye (a) and the resulting mixture was stirred again at 15,000 r.p.m for 20 minutes using homogenizer.

Preparation of light-sensitive microcapsule

A light-sensitive microcapsule dispersion (B-2) was prepared in the same manner as in the preparation of the light-sensitive microcapsule dispersion (A), except that the light-sensitive composition (B-2) was used in place of the light-sensitive composition (A).

Preparation of the light-sensitive material

A light-sensitive material (III) was prepared in the same manner as in Reference Example 1, except that 10 g of light-sensitive microcapsule dispersion (B-2) was used in place of 10 g of light-sensitive microcapsule dispersion (A).

EXAMPLE 2

Preparation of light-sensitive composition

A light-sensitive composition (B-3) was prepared in the same manner as in Example 1, except that the amount of the dispersion of the dye (a) was changed from 0.6 g to 1.2 g.

Preparation of light-sensitive microcapsule

A light-sensitive microcapsule dispersion (B-3) was prepared in the same manner as in Reference Example 1, except that the light-sensitive composition (B-3) was prepared in place of the light-sensitive composition (A).

Preparation of light-sensitive material

A light-sensitive material (IV) was prepared in the same manner as in Reference Example 1, except that 10 g of the light-sensitive microcapsule dispersion (B-3) was used in place of 10 g of the light-sensitive microcapsule dispersion (A).

EXAMPLE 3

Preparation of light-sensitive composition

A light-sensitive composition (B-4) was prepared in the same manner as in Example 1, except that the amount of the dispersion of the dye (a) was changed from 0.6 g to 3 g.

Preparation of light-sensitive microcapsule

A light-sensitive microcapsule dispersion (B-4) was prepared in the same manner as in Reference Example 1, except that the light-sensitive composition (B-4) was used in place of the light-sensitive composition (A).

Preparation of light-sensitive material

A light-sensitive material (V) was prepared in the same manner as in Reference Example 1, except that 10 g of the light-sensitive microcapsule dispersion (B-4) was used in place of 10 g of the light-sensitive microcapsule dispersion (A).

COMPARISON EXAMPLE 2

Preparation of silver halide emulsion

A silver halide emulsion (C) was prepared in the same manner as in Comparison Example 1, except that 47 ml of 1% methanol solution of the following sensitizing dye (c) was used in place of 50 ml of 1% methanol solution of the sensitizing dye (b).

(Sensitizing dye (c))

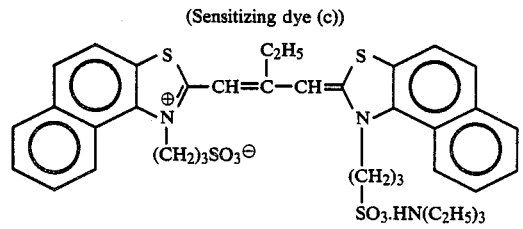

Preparation of light-sensitive composition

A light-sensitive composition (C-1) was prepared in the same manner as in Reference Example 1, except that 0.8 g of the silver halide emulxion (C) was used in place of 1 g of the silver halide emulsion (A), and 12 g of the color image forming substance (c) was used in place of 13 g of the color image forming substance (a).

(Color image forming substance (c))

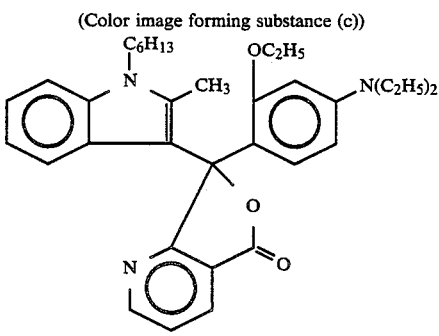

Preparation of light-sensitive microcapsule

A light-sensitive microcapsule dispersion (C-1) was used in the same manner as in Reference Example 1, except that the light-sensitive composition (C-1) was used in place of the light-sensitive composition (A).

Preparation of light-sensitive material

A light-sensitive material (VI) was prepared in the same manner as in Reference Example 1, except that 10 g of the light-sensitive microcapsule dispersion (C-1) was used in place of 10 g of light-sensitive microcapsule dispersion (A).

EXAMPLE 4

Preparation of light-sensitive composition

A light-sensitive composition (C-2) was prepared in the same manner as in the preparation of the light-sensitive composition (C-1), except that to the mixture which has been stirred at 15,000 r.p.m for 10 minutes using homogenizer was further added 0.7 g of the dispersion of the dye (a) and the resulting mixture was stirred again at 15,000 r.p.m. for 20 minutes using homogenizer.

Preparation of light-sensitive microcapsule

A light-sensitive microcapsule dispersion (C-2) was prepared in the same manner as in the preparation of the light-sensitive microcapsule dispersion (A), except that the light-sensitive composition (C-2) was used in place of the light-sensitive composition (A).

Preparation of light-sensitive material

A light-sensitive material (VII) was prepared in the same manner as in Reference Example 1, except that 10 g of the light-sensitive microcapsule dispersion (C-2) was used in place of 10 g of the light-sensitive microcapsule dispersion (A).

EXAMPLE 5

Preparation of light-sensitive composition

A light-sensitive composition (C-3) was prepared in the same manner as in the preparation of the light-sensitive composition (C-2), except that the amount of the dispersion of the dye (a) was changed from 0.7 g to 1.5 g.

Preparation of light-sensitive microcapsule

A light-sensitive microcapsule dispersion (C-3) was prepared in the same manner as in the preparation of the light-sensitive microcapsule dispersion (A), except that the light-sensitive composition (C-3) was used in place of the light-sensitive composition (A).

Preparation of light-sensitive material

A light-sensitive material (VIII) was prepared in the same manner as in Reference Example 1, except that 10 g of light-sensitive microcapsule dispersion (C-3) was used in place of 10 g of the light-sensitive microcapsule dispersion (A).

EXAMPLE 6

Preparation of light-sensitive composition

A light-sensitive composition (C-4) was prepared in the same manner as in the preparation of the light-sensitive composition (C-2), except that the amount of the dispersion of the dye (a) was changed from 0.7 g to 3.7 g.

Preparation of light-sensitive microcapsule

A light-sensitive microcapsule (C-4) was prepared in the same manner as in the preparation of the light-sensitive microcapsule dispersion (A), except that the light-sensitive composition (C-4) was used in place of the light-sensitive composition (A).

Preparation of light-sensitive material

A light-sensitive material (IX) was prepared in the same manner as in Reference Example 1, except that 10 g of the light-sensitive microcapsule dispersion (C-4) was used in place of 10 g of the light-sensitive microcapsule dispersion (A).

REFERENCE EXAMPLE 2

Preparation of silver halide emulsion

In 500 ml of water were dissolved 14 g of gelatin and 2 g of sodium chrolide, and the resulting gelatin solution was adjusted to a pH of 3.8 using 1N sulfuric acid, and was kept at 75° C. To the gelatin solution, 1,000 ml of an aqueous solution containing 70 g of potassium bromide and 1,000 ml of an aqueous solution containing 0.59 mole of silver nitrate were added simultaneously at the same feed rate over a period of 50 minutes. After 2 minutes, to the solution, 100 ml of an aqueous solution containing 5.9 g of potassium iodide was added over a period of 10 minutes to obtain a silver iodobromide emulsion having tetradecahedral grains, uniform grain size distribution, and a mean grain size of 0.28 μm.

The emulsion was washed for desalting and then added 57 ml of 1% methanol solution of the sensitizing dye (a), 35 ml of 1% methanol solution of the sensitizing dye (b) and 33 ml of 1% methanol solution of the sensitizing dye (c) to obtain a silver halide emulsion (D). The yield emulsion was 600 g.

Preparation of light-sensitive composition

In 100 g of trimethylolpropane triacrylate were dissolved 0.2 g of the following copolymer (d), the following color image forming substance (d) and 0.3 g of Emulex NP-8 (produced by Nippon Emulsion Co., Ltd.)

(Copolymer (d))

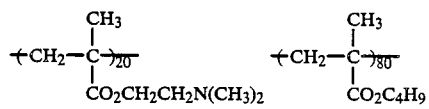

(Color image forming substance (d))

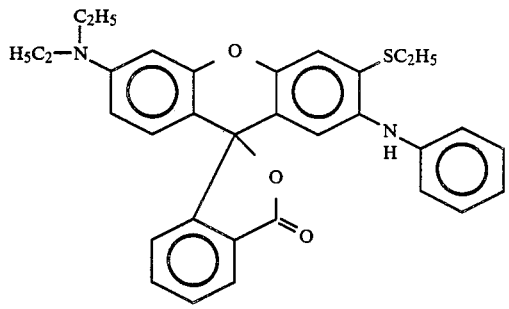

In 18 g of the resulting solution were dissolved 0.5 g of the reducing agent (I) and 0.8 g of the reducing agent (II). To the solution were further added 1.2 g of the silver halide emulsion (D) and 0.1 g of the silver benzotriazole emulsion, and the mixture was stirred at 15,000 r.p.m. for 10 minutes to obtain a light-sensitive composition (D).

Preparation of light-sensitive microcapsule

A light-sensitive microcapsule dispersion (D) was prepared in the same manner as in the preparation of the light-sensitive microcapsule dispersion (A), except that the light-sensitive compositon (D) was used in place of the light-sensitive composition (A).

Preparation of light-sensitive material

A light-sensitive material (X) was prepared in the same manner as in Reference Example 1, except that 10 g of the light-sensitive microcapsule dispersion (D) was used in place of 10 g of the light-sensitive microcapsule dispersion (A).

Preparation of image-receiving material

To 125 g of water was added 11 g of 40% aqueous solution of sodium hexametaphosphate, and were further added 51 g of zinc 3,5-di-α-methylbenzylisalicylate and 82 g of 55% slurry of calcium carbonate, followed by coarsely dispersing in a mixer.

The coarse dispersion was then finely dispersed in Dynomill dispersing device. To 200 g of the resulting dispersion were added 12 g of 50% latex of SBR (styrene-butadiene rubber) and 77 g of 8% aqueous solution of polyvinyl alcohol, and the resulting mixture was made uniform. The mixture was then uniformly coated on a coated paper (cast coat paper; produced by Sanyo Pulp Co., Ltd.) having a basis weight of 65 g/m² to give a layer having a wet thickness of 36 μm and dried to obtain an image-receiving material.

Evaluation of light-sensitive material

Each of the light-sensitive materials (I) to (X) prepared in Reference Examples 1 & 2, Comparison Examples 1 & 2 and Examples 1 to 6 was imagewise exposed to light using a tungsten lamp at 200 lux for 1 second through a filter (wedge) in which the density was continuously changed and then heated on a hot plate at 125° C. for 25 seconds. Each of the exposed and heated light-sensitive materials was then combined with the image-receiving material and passed through press rolls under pressure of 650 kg/cm². The density of the positive color image obtained on the image-receiving material was measured using Macbeth reflection densitometer, and then each of the relative sensitivities to light (blue, green and red) was evaluated.

The results are set forth in Table 1.

TABLE 1

| Light-Sensitive Material | Microcapsule Dispersion | Relative Sensitivity | | | Developed Hue |
|---|---|---|---|---|---|
| | | blue | green | red | |
| (I) | (A) | 100 | 0 | 0 | Yellow |
| (II) | (B-1) | 42 | 97 | 0 | Magenta |
| (III) | (B-2) | 26 | 97 | 0 | Magenta |
| (IV) | (B-3) | 16 | 95 | 0 | Magenta |
| (V) | (B-4) | 4 | 90 | 0 | Magenta |
| (VI) | (C-1) | 43 | 0 | 95 | Cyan |
| (VII) | (C-2) | 27 | 0 | 95 | Cyan |
| (VIII) | (C-3) | 17 | 0 | 93 | Cyan |
| (IX) | (C-4) | 4 | 0 | 89 | Cyan |
| (X) | (D) | 126 | 132 | 129 | Black |

It is apparent from the results in Table 1 that in each of the light-sensitive materials of the present invention (III) to (V) and (VII) to (IX), the sensitivity of silver halide outside a desired wave length region was reduced.

The dye (a) contained in each of the light-sensitive materials (III) to (V) and (VII) to (IX) was sufficiently decolorized in the course of the heat development process (at 125° C. for 25 seconds) of the image forming method.

COMPARISON EXAMPLE 3

Preparation of light-sensitive material

A light-sensitive material (XI) was prepared in the same manner as in Reference Example 1, except that a mixture of 4.0 g of the microcapsule dispersion (A), 2.5 g of the microcapsule dispersion (B-1) and 3.5 g of the microcapsule dispersion (C-1) was used in place of 10 g of the microcapsule dispersion (A).

EXAMPLE 7

Preparation of light-sensitive material

A light-sensitive material (XII) was prepared in the same manner as in Reference Example 1, except that a mixture of 4.0 g of the microcapsule dispersion (A), 2.5 g of the microcapsule dispersion (B-2) and 3.5 g of the microcapsule dispersion (C-2) was used in place of 10 g of the microcapsule dispersion (A).

EXAMPLE 8

Preparation of light-sensitive material

A light-sensitive material (XIII) was prepared in the same manner as in Reference Example 1, except that a mixture of 4.0 g of the microcapsule dispersion (A), 2.5 g of the microcapsule dispersion (B-3) and 3.5 g of the microcapsule dispersion (C-3) was used in place of 10 g of the microcapsule dispersion (A).

EXAMPLE 9

Preparation of light-sensitive material

A light-sensitive material (XIV) was prepared in the same manner as in Reference Example 1, except that a mixture of 4.0 g of the microcapsule dispersion (A), 2.5 g of the microcapsule dispersion (B-4) and 3.5 g of the microcapsule dispersion (C-4) was used in place of 10 g of the microcapsule dispersion (A).

COMPARISON EXAMPLE 4

Preparation of light-sensitive material

A light-sensitive material (XV) was prepared in the same manner as in Reference Example 1, except that a mixture of 3.5 g of the microcapsule dispersion (A), 2.2 g of the microcapsule dispersion (B-1), 2.8 g of the microcapsule dispersion (C-1) and 1.5 g of the microcapsule dispersion (D) was used in place of 10 g of the microcapsule dispersion (A).

EXAMPLE 10

Preparation of light-sensitive material

A light-sensitive material (XVI) was prepared in the same manner as in Reference Example 1, except that a mixture of 3.5 g of the microcapsule dispersion (A), 2.2 g of the microcapsule dispersion (B-2), 2.8 g of the microcapsule dispersion (C-2) and 1.5 g of the microcapsule dispersion (D) was used in place of 10 g of the microcapsule dispersion (A).

EXAMPLE 11

Preparation of light-sensitive material

A light-sensitive material (XVII) was prepared in the same manner as in Reference Example 1, except that a mixture of 3.5 g of the microcapsule dispersion (A), 2.2 g of the microcapsule dispersion (B-4), 2.8 g of the microcapsule dispersion (C-4) and 1.5 g of the microcapsule dispersion (D) was used in place of 10 g of the microcapsule dispersion (A).

EXAMPLE 12

Preparation of light-sensitive composition

A light-sensitive composition (B-5) was prepared in the same manner as in the preparation of the light-sensitive composition (B-2), except that 0.6 g of the following dye (b), which has a property of being decolorized when it is heated, 11 mg of the following copolymer (b) and a solution in which 1 mg of piridine was dissolved in 2 ml of methylene chloride were added in place of 0.6 g of the dispersion of the dye (a).

(Dye (b))

[chemical structure]

(Copolymer (b))

[chemical structure]

Preparation of light-sensitive microcapsule

A light-sensitive microcapsule dispersion (B-5) was prepared in the same manner as in the preparation of the light-sensitive microcapsule dispersion (A), except that the light-sensitive composition (B-5) was used in place of the light-sensitive composition (A).

Preparation of light-sensitive composition

A light-sensitive composition (C-5) was prepared in the same manner as in the preparation of the light-sensitive composition (C-2), except that 11 mg of the (b), 12 mg of the copolymer (b) and a solution in which 1 mg of piridine was dissolved in 2 ml of methylene chloride were added in place of 0.7 g of the dispersion of the dye (a).

Preparation of light-sensitive microcapsule

A light-sensitive microcapsule dispersion (C-5) was prepared in the same manner as in the preparation of the light-sensitive microcapsule dispersion (A), except that the light-sensitive composition (C-5) was used in place of the light-sensitive composition (A).

Preparation of light-sensitive material

A light-sensitive material (XVIII) was prepared in the same manner as in Reference Example 1, except that a mixture of 4 g of the microcapsule dispersion (A), 2.5 g of the microcapsule dispersion (B-5) and 3.5 g of the microcapsule dispersion (C-5) was used in place of 10 g of the microcapsule dispersion (A).

EXAMPLE 13

Preparation of light-sensitive material

A light-sensitive material (XIX) was prepared in the same manner as in Reference Example 1, except that a mixture of 3.5 g of the microcapsule dispersion (A), 2.2 g of the microcapsule dispersion (B-5), 2.8 g of the microcapsule dispersion (C-5) and 1.5 g of the microcapsule dispersion (D) was used in place of 10 g of the microcapsule dispersion (A).

Evaluation of light-sensitive material

Each of the light-sensitive materials prepared in Comparison Examples 3 & 4 and Examples 7 to 13 was imagewise exposed to light using a tungsten lamp at 200 lux for 1 second through a filter (wedge) in which the density was continuously changed and then heated on a hot plate at 125° C. for 25 seconds. Each of the exposed and heated light-sensitive materials was then combined with the image-receiving material and passed through press rolls under pressure of 650 kg/cm$^2$. The density of the positive color image obtained on the image-receiving material was measured using Macbeth reflection densitometer, and then each of the relative sensitivities to light (blue, green and red) was evaluated.

The results are set forth in Table 2.

TABLE 2

| Light-Sensitive Material | Microcapsule Dispersion | Relative Sensitivity | | |
|---|---|---|---|---|
| | | blue | green | red |
| (XI) | (A) + (B-1) + (C-1) | 95 | 92 | 93 |
| (XII) | (A) + (B-2) + (C-2) | 95 | 91 | 92 |
| (XIII) | (A) + (B-3) + (C-3) | 95 | 89 | 90 |
| (XIV) | (A) + (B-4) + (C-4) | 93 | 83 | 87 |
| (XVIII) | (A) + (B-5) + (C-5) | 95 | 90 | 91 |
| (XV) | (A) + (B-1) + (C-1) + (D) | 93 | 91 | 92 |
| (XVI) | (A) + (B-2) + (C-2) + (D) | 93 | 91 | 92 |
| (XVII) | (A) + (B-4) + (C-4) + (D) | 89 | 82 | 84 |
| (XIX) | (A) + (B-5) + (C-5) + (D) | 92 | 90 | 91 |

Further, the tubidity of the obtained full color image was evaluated in terms of the content of a magenta color within the yellow area and the content of a cyan color within the yellow area.

The result are set forth in Table 3. In Table 3, the content of a magenta color within the yellow area (X) and the content of a cyan color within the yellow area (Y) were calculated according to the following formulas.

$$X = \frac{\text{Magenta content (density of green filter)}}{\text{Yellow content (density of blue filter)}} \times 100$$

$$Y = \frac{\text{Cyan content (density of red filter)}}{\text{Yellow content (density of blue filter)}} \times 100$$

TABLE 3

| Light-sensitive Material | Content of Magenta within Yellow Area | Content of Cyan within Yellow area |
|---|---|---|
| (XI) | 39% | 45% |
| (XII) | 32% | 37% |
| (XIII) | 27% | 34% |
| (XIV) | 25% | 31% |
| (XVIII) | 31% | 37% |
| (XV) | 39% | 44% |
| (XVI) | 33% | 37% |
| (XVII) | 25% | 30% |
| (XIX) | 37% | 42% |

It is apparent from the results in Table 3 that each of the light-sensitive materials of the present invention (XII) to (XIV) and (XVI) to (XIX) gave a clear full color image in which the turbidity of the color was reduced.

Further, employing each of the light-sensitive materials (XVI), (XVII) and (XIX), a black color area such as character was clearly reproduced on the image.

We claim:

1. A light-sensitive material comprising a light-sensitive layer containing silver halide, a reducing agent, an ethylenically unsaturated polymerizable compound and a color image forming substance provided on a support, said silver halide, polymerizable compound and color image forming substance being contained in microcapsules having a shell which are dispersed in the light-sensitive layer, wherein the microcapsules comprise at least three kinds of microcapsules (I), (II) and (III), the microcapsules (I) containing a blue sensitive silver halide, an ethylenically unsaturated polymerizable compound and a color image forming substance, the microcapsules (II) containing a green sensitive silver halide, an ethylenically unsaturated polymerizable compound and a color image forming substance and a yellow dye having a property of being decolorized when it is heated or irradiated with light, and the microcapsules (III) containing a red sensitive silver halide, an ethylenically unsaturated polymerizable compound, a color image forming substance and a yellow dye having a property of being decolorized when it is heated or irradiated with light, and said yellow dye being different from the color image forming substance.

2. The light-sensitive material as claimed in claim 1, wherein the microcapsules comprise at least three kinds of microcapsules (I), (II) and (III), the microcapsules (I) containing a blue sensitive silver halide, an ethylenically unsaturated polymerizable compound and a yellow color image forming substance, the microcapsules (II) containing a green sensitive silver halide, an ethylenically unsaturated polymerizable compound, a magenta color image forming substance and a yellow dye having a property of being decolorized when it is heated or irradiated with light, and the microcapsules (III) containing a red sensitive silver halide, an ethylenically unsaturated polymerizable compound, a cyan color image forming substance and a yellow dye having a property of being decolorized when it is heated or irradiated with light.

3. The light-sensitive material as claimed in claim 1, wherein the microcapsules comprise at least four kinds of microcapsules (I), (II), (III) and (IV), the microcapsules (I) containing a blue sensitive silver halide, an ethylenically unsaturated polymerizable compound and a yellow color image forming substance, the microcapsules (II) containing a green sensitive silver halide, an ethylenically unsaturated polymerizable compound, a magenta color image forming substance and a yellow dye having a property of being decolorized when it is heated or irradiated with light, the microcapsules (III) containing a red sensitive silver halide, an ethylenically unsaturated polymerizable compound, a cyan color image forming substance and a yellow dye having a property of being decolorized when it is heated or irradiated with light, and the microcapsules (IV) containing silver halide, an ethylenically unsaturated polymerizable compound and a black color image forming substance.

4. The light-sensitive material as claimed in claim 1, wherein the dye contained in the microcapsules has a property of being decolorized when it is heated at a temperature of not lower than 60° C.

5. The light-sensitive material as claimed in claim 1, wherein the dye contained in the microcapsules has a property of being decolorized when it is irradiated with light in an illuminance of not less than 100 lux.

6. The light-sensitive material as claimed in claim 1, wherein the yellow dye contained in the microcapsules is a compound having the following formula:

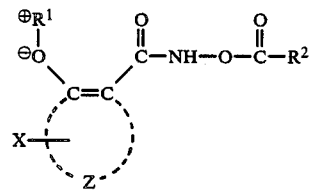

in which Z is a hydrocarbon chain which forms a 6-membered ring or a condensed ring thereof; X is a substituent group having a function of forming a chromophoric group having an absorption maximum at not less than 350 nm in conjugation with $-O.R^1$; $R^1$ is a monovalent cation selected from the group consisting of hydrogen ion, a metal ion and a quaternary ammonium ion, and when $R^1$ is hydrogen, $-O.R^1$ forms hydroxyl; and $R^2$ is a monovalent group selected from the group consisting of hydrogen, an alkyl group, an aryl group, a heterocyclic group, amino and anilino, each of which may have one or more substituent groups.

7. The light-sensitive material as claimed in claim 1, wherein the light-sensitive layer further contains a spectral sensitizing dye, which is adsorbed on the silver halide.

8. The light-sensitive material as claimed in claim 1, wherein the reducing agent is contained in each of the microcapsules.

9. The light-sensitive material as claimed in claim 1, wherein each of the microcapsules further contains an organic silver salt.

10. The light-sensitive material claimed in claim 1, wherein the yellow dye is contained in the shell of the microcapsules.

* * * * *